United States Patent
Huang et al.

(10) Patent No.: US 7,259,463 B2
(45) Date of Patent: Aug. 21, 2007

(54) DAMASCENE INTERCONNECT STRUCTURE WITH CAP LAYER

(75) Inventors: Jui Jen Huang, Hsin-Chu (TW); Minghsing Tsai, Chu-Pei (TW); Shau-Lin Shue, Hsin-Chu (TW); Hung-Wen Su, Jhubei (TW); Ting-Chu Ko, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 124 days.

(21) Appl. No.: 11/004,767

(22) Filed: Dec. 3, 2004

(65) Prior Publication Data
US 2006/0118962 A1 Jun. 8, 2006

(51) Int. Cl.
*H01L 23/48* (2006.01)
(52) U.S. Cl. .................... 257/758; 257/762
(58) Field of Classification Search ........ 257/758–760, 257/761–766
See application file for complete search history.

(56) References Cited

U.S. PATENT DOCUMENTS

| | | | |
|---|---|---|---|
| 6,130,157 A | 10/2000 | Liu et al. | |
| 6,181,013 B1 | 1/2001 | Liu et al. | |
| 6,255,734 B1 | 7/2001 | Liu et al. | |
| 6,869,810 B2* | 3/2005 | Joei | 438/14 |
| 2004/0058547 A1* | 3/2004 | Morrow et al. | 438/694 |
| 2005/0098892 A1* | 5/2005 | Hu et al. | 257/758 |

OTHER PUBLICATIONS

Ko, T., et al., "High Performance/Reliability Cu Interconnect with Selective CoWP Cap," 2003 Symposium on VLSI Technology Digest of Technical Papers, pp. 109-110.
Awaya, N., et al., "Self-Aligned Passivation Technology for Copper Interconnection Using Copper-Aluminum Alloy," Jpn. J. Appl. Phys., vol. 36, Part 1, No. 3B, Mar. 1997, pp. 1548-1553.
Krishnan, A., et al., "Copper Metallization for VLSI Applications," VMIC Conference, Jun. 9-10, 1992, pp. 226-231.
Colgan, E.G., "Selective CVD-W for Capping Damascene Cu Lines," Thin Solid Films, 262, 1995, pp. 120-123.

\* cited by examiner

*Primary Examiner*—Mark V. Prenty
(74) *Attorney, Agent, or Firm*—Slater & Matsil, L.L.P.

(57) ABSTRACT

A method of forming an integrated circuit interconnect structure is presented. A first conductive line is formed over a semiconductor substrate. A conductive cap layer is formed on the first conductive line to improve device reliability. An etch stop layer (ESL) is formed on the conductive cap layer. An inter-level dielectric (IMD) is formed on the ESL. A via opening and a trench are formed in the ESL, IMD, and conductive cap layer. A recess is formed in the first conductive line. The recess can be formed by over etching when the first dielectric is etched, or by a separate process such as argon sputtering. A second conductive line is formed filling the trench, opening and recess.

9 Claims, 5 Drawing Sheets

DAMASCENE INTERCONNECT STRUCTURE WITH CAP LAYER

TECHNICAL FIELD

This invention relates generally to metallization of the integrated circuit, and more specifically to damascene process.

BACKGROUND

Conventional integrated circuit contains a plurality of patterns of metal lines separated by inter-wiring spacings, and a plurality of interconnect lines, such as bus lines, bit lines, word lines and logic interconnect lines. Typically, the metal patterns of vertically spaced metallization layers are electrically interconnected by vias. Metal lines formed in trench-like openings typically extend substantially parallel to the semiconductor substrate. Semiconductor devices of such type according to current technology may comprise eight or more levels of metallization to satisfy device geometry and micro miniaturization requirements.

A common method for forming metal lines or plugs is known as "damascene". Generally, this process involves forming an opening in the dielectric interlayer, which separates the vertically spaced metallization layers. The opening is typically formed using conventional lithographic and etching techniques. After an opening is formed, the opening is filled with copper or copper alloys to form a via. Excess metal material on the surface of the dielectric interlayer is then typically removed by chemical mechanical planarization (CMP).

Copper has replaced aluminum because of its lower resistivity and higher reliability, which was expected to be better because of its higher activation energy for diffusion. However, copper still suffers from electro migration (EM) and stress migration (SM) reliability issues as geometries continue to shrink, and current densities increase.

FIG. 1 illustrates a cross sectional view of a conventional interconnection structure 1 formed using damascene process. Metal lines 2 and 4, which are typically formed of copper or copper alloys, are interconnected by via 10. Inter-metal-dielectric (IMD) 8 separates two layers that metal lines 2 and 4 locate. Etch stop layer (ESL) 5 is formed on lower layer copper line 2. Diffusion barrier layers 12 and 14 are formed to prevent copper from diffusing into surrounding materials. The interconnection structure 1 in FIG. 1 suffers from electro migration and stress migration problems. Since the copper line 2 is in direct contact with a dielectric ESL 5, the character difference between copper 2 and dielectric ESL 5 causes higher electro migration and stress migration; therefore device reliability is degraded. FIG. 2 illustrates an improvement made to the conventional interconnection structure 1 by forming a metal cap layer 16 on the copper line 2. Cap layer 16 is typically formed of materials suffering less from electro migration. This layer greatly improved the reliability of the interconnections structure 15 by removing the interface between copper line 2 end dielectric layer 5. The copper surface migration of structure 15 is reduced. It has been found that under stressed conditions, the mean time to failure (MTTF) of the interconnection structure 3 is ten times longer than that of the interconnection structure 1 due to the reduction of electro migration. With the cap layer 16 formed, the stress induced void formation is also significantly reduced.

However, the introduction of the cap layer 16 generates another problem. IMD 8 is etched in order to form an opening for via and then ESL 5 is etched. Metal cap layer 16 is typically etched through due to over etching when ESL 5 is etched. In conventional formation of the interconnect structure, the process is only controlled so that the over etching stops at a time after the ESL 5 has been etched out. Typically, over etching may stop in cap layer 16 or copper 2. If over etching lands in cap layer 16, since metal cap 16 normally has a higher resistance than copper 2, the resistance of the remaining cap layer 16 contributes to the resistance of the interconnection. Higher resistance of the interconnection causes higher RC delay of the integrated circuits; if over etching stops in copper line 2, the contact resistance is much smaller than the contact resistance having a remaining cap layer 16. Therefore, contact resistance and RC delay varies from process to process and is harder to predict.

In order to reduce contact resistance and RC delay, and reduce process variation, a new method of forming interconnection structures is needed.

SUMMARY OF THE INVENTION

The preferred embodiment of the present invention presents a method of forming an integrated circuit interconnect structure having a metal cap on a conductive line.

In accordance with one aspect of the present invention, a first conductive line is formed over a semiconductor substrate. A conductive cap layer is formed on the first conductive line. An etch stop layer (ESL) is formed on the conductive cap layer. An inter-metal-dielectric (IMD) is formed on the ESL. A via opening and a trench are formed in the ESL, IMD and conductive cap layer. A recess is formed in the first conductive line. The recess can be formed by over etching when the first dielectric is etched, or by a separate process such as argon sputtering. A second conductive line is formed filling the trench, via opening and recess.

With a conductive cap on the first conductive line, the reliability and performance of the interconnection structure is significantly improved. The preferred embodiment of the present invention eliminates the possibility that the second conductive line is coupled to the first conductive line through the cap layer, which causes higher contact resistance and thus higher RC delay.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
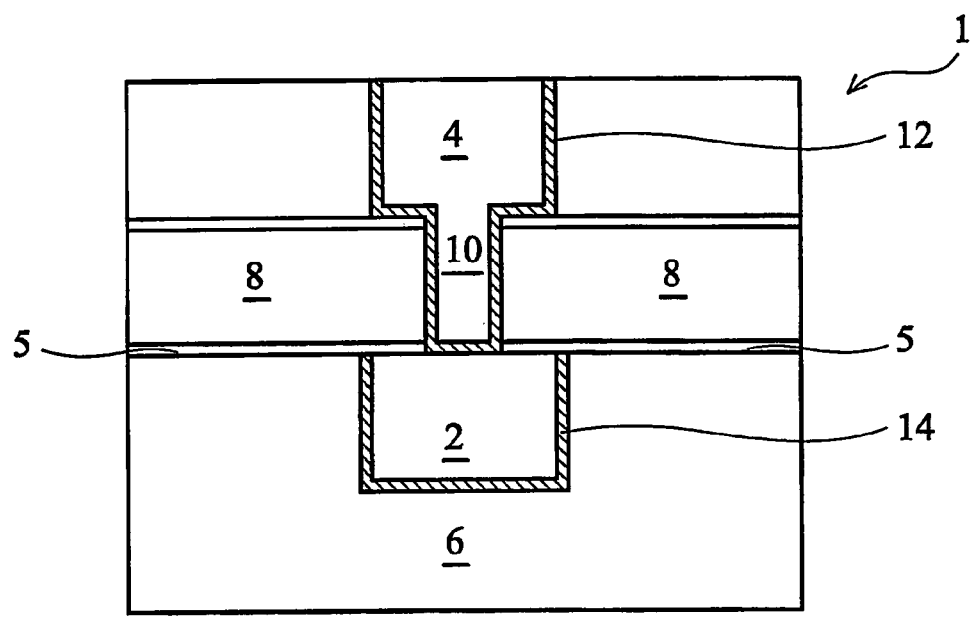
FIG. 1 illustrates a conventional interconnection structure with no metal cap formed.
Figure 2:
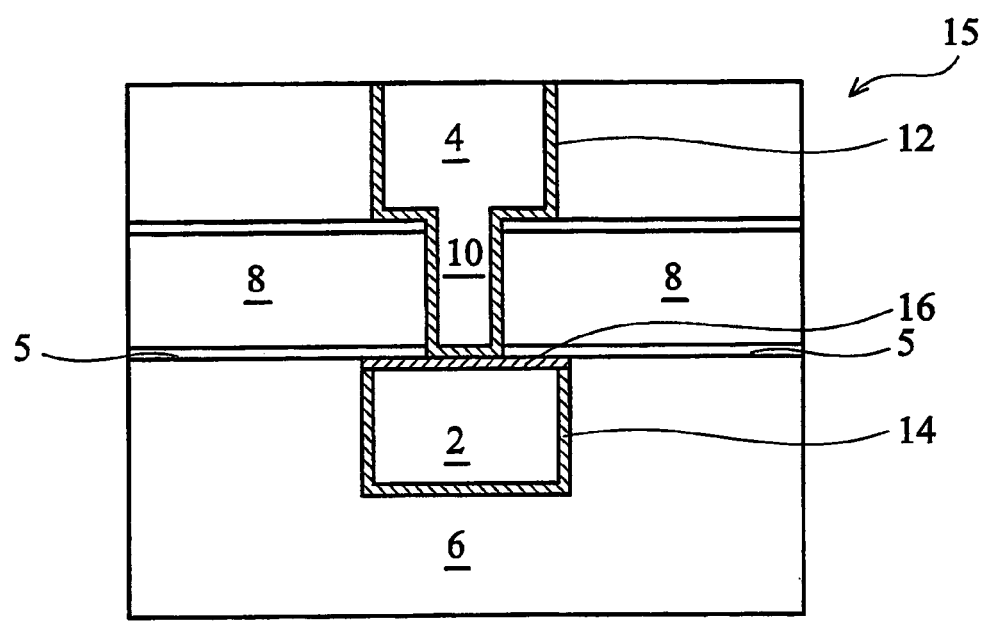
FIG. 2 illustrates a conventional interconnection structure with a metal cap formed.
Figure 3:
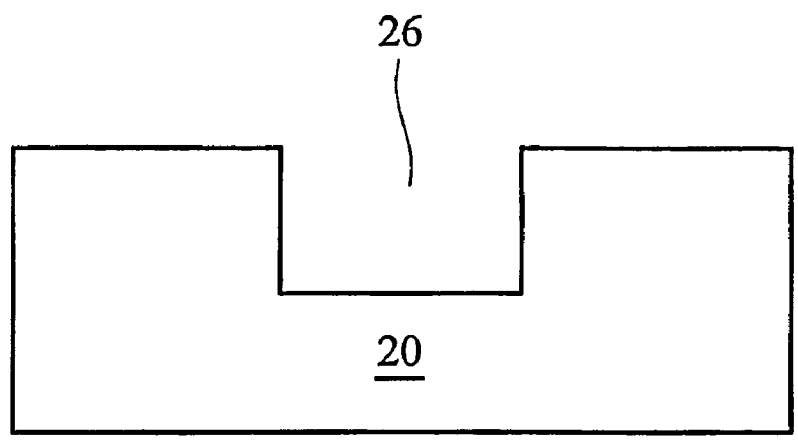
FIGS. 3 through 10 are cross-sectional views of intermediate stages in the making of a preferred embodiment of the present invention.

FIGS. 3 through 10 are cross-sectional views of intermediate stages in the making of a preferred embodiment of the present invention. A via connecting two conductive lines are formed. FIG. 3 illustrates formation of a trench 26 in a base material 20. In the preferred embodiment, base material 20 is an IMD preferably comprising a material having a dielectric constant (K value) lower than about 3.3 and contains nitrogen, carbon, hydrogen, oxygen, fluorine and their combinations. In alternative embodiments, base material 20 can be a silicon substrate or other non-conductive material.

Figure 4:
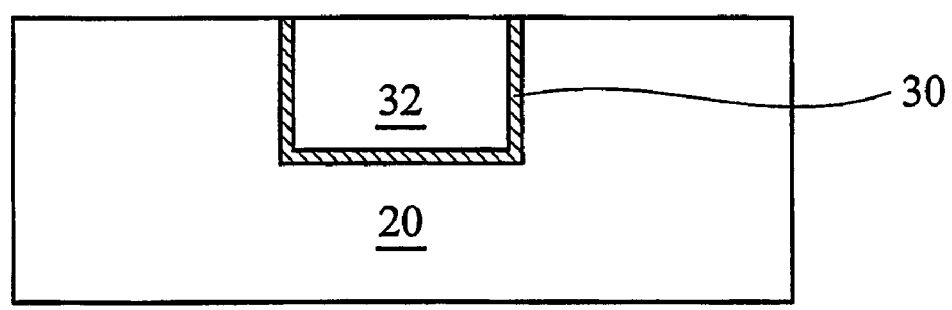

FIG. 4 illustrates a diffusion barrier layer 30 and a conductive line 32 formed in trench 26. Barrier layer 30 is preferably formed of a material comprising titanium, titanium nitride, tantalum, tantalum nitride, or other alternatives. The material of the conductive line 32 is preferably a copper or copper alloys comprising at least about 10 atomic percent of copper. Through out the description, conductive line 32 may alternatively referred as copper 32 although it may comprise other conductive materials. In one embodiment, conductive line 32 comprises at least 50 atomic percent of aluminum. In yet other embodiments, conductive line 32 comprises silver or gold. Conductive line 32 preferably has a good conductivity with resistivity lower than about 4 ohm-cm and is typically formed by depositing a thin layer of seed copper or copper alloy, then plating to fill the trench 26. A chemical mechanical planarization (CMP) is performed to level the surface of copper 32.

Figure 5:
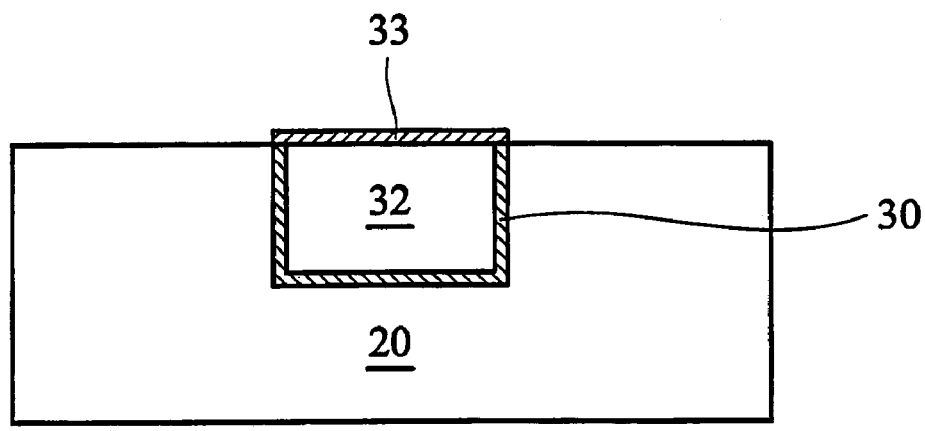

FIG. 5 illustrates a metal cap 33 formed on conductive line 32 and optionally on barrier layer 30. The metal cap 33 preferably comprises materials such as cobalt, nickel, tungsten, molybdenum, tantalum, boron, and phosphorus. These materials may exist in the form of CoP, CoB, CoWP, CoWB, NiWP, CoSnP, NiWB, CuSi, ZrN, NiMoP and their combinations. Metal cap 33 has a preferred thickness of about 2 nm to 20 nm. Since metal cap 33 has a better characteristic match with conductive line 32 than a dielectric, electro migration and stress migration are reduced and thus device reliability is improved. In the preferred embodiment, conductor line 32 is a copper or copper alloys so that metal cap 33 can be formed as a copper silicide. Growth of copper silicide 33 can be performed by a chemical vapor reaction (CVR) process that involves introducing a chemical vapor of $SiH_4$ gas into a chamber at a temperature from about 200° C. to about 420° C. to react with copper. In other embodiments, metal cap 33 can be formed by electroless plating. In yet other embodiments, metal cap 33 can be deposited using common techniques such as sputtering and CVD and then etched. Metal cap 33 preferably has a thickness of between about 2 nm to about 20 nm, more preferably about 10 nm.

Figure 6:
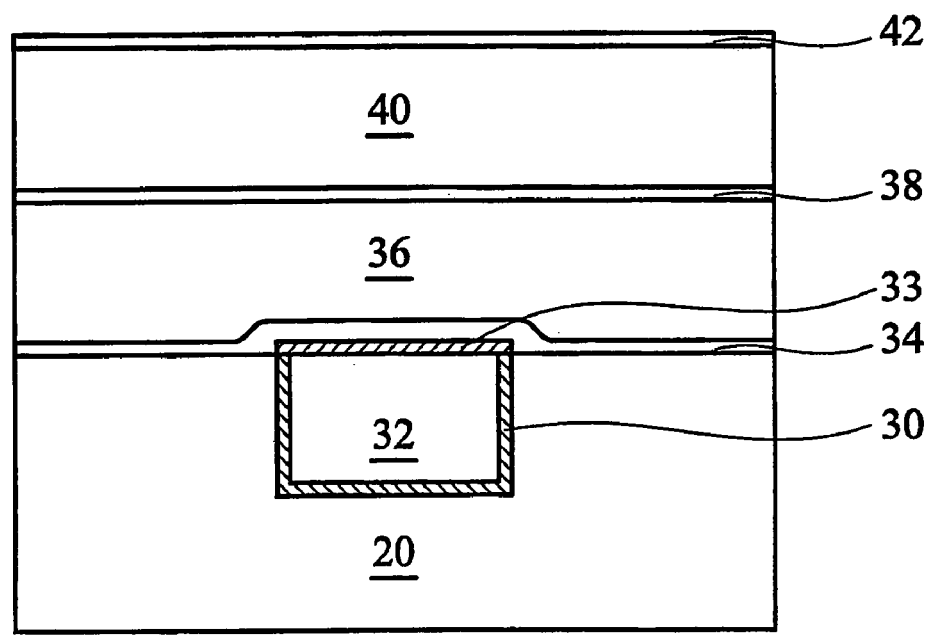

In the preferred embodiment, after the conductive line 32 and metal cap 33 are formed, a dual damascene process is preferably performed to form a via and a second copper line. In alternative embodiments, the via and second copper line can be formed by single damascene process. FIG. 6 shows a via etching stop layer (ESL) 34 formed on cap layer 32 and base material 20. Via ESL 34 is preferably a dielectric material comprising carbon, silicon, nitrogen, and oxygen and having a k value of less than about 5. The thickness of the ESL 34 is preferably smaller than about 80 nm. A via IMD layer 36 is formed on the via ESL layer 34 providing insulation between copper line 32 and a second copper line that will be formed subsequently. The via IMD 36 preferably has a k value less than about 3.4 and comprises carbon-doped silicon oxide, fluorine-doped silicon oxide, organic low-k material and porous low-k material. It is preferably formed by a spin-on, a chemical vapor deposition (CVD) or other known methods. A trench IMD 40 is then formed, as also shown in FIG. 6. The trench IMD 40 is preferably formed by similar methods and using similar materials as IMD 36. The materials and methods of forming via ESL 34, via IMD 36, and trench IMD 40 are known in the art.

Figure 7:
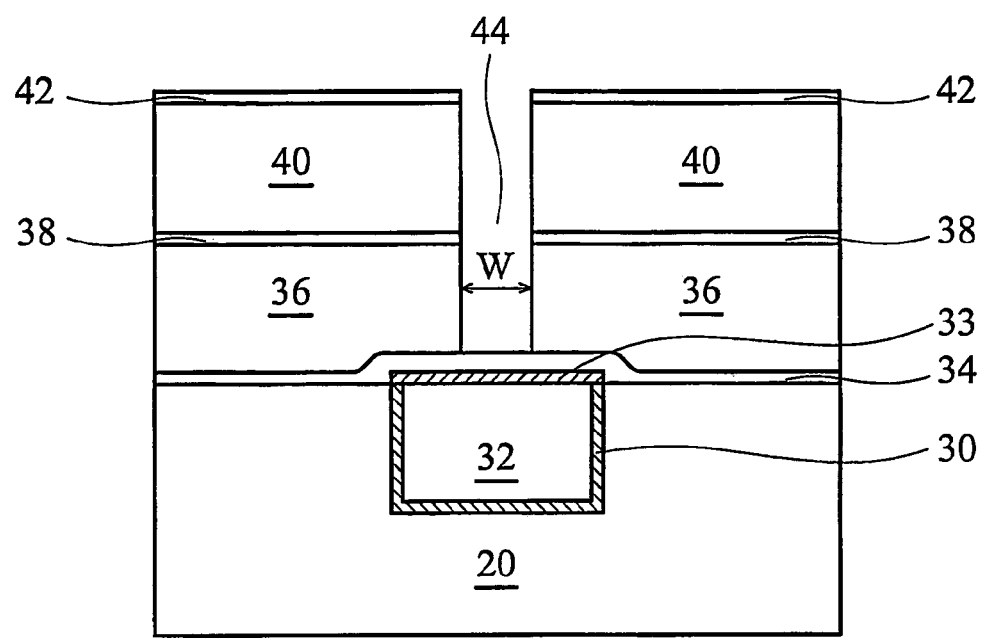

FIG. 7 illustrates formation of a via opening 44. A photo resist material (not shown) is formed and patterned over the trench IMD 40. An anisotropic etch, preferably using fluorine containing etching gases, cuts through the trench IMD 40, via IMD 36 and stops at the via ESL 34, therefore forming a via opening 44. The via ESL 34 protects the underlying first conductive line 32 from being etched. The length and width W of via opening 44 are preferably smaller than about 500 nm.

Figure 8:
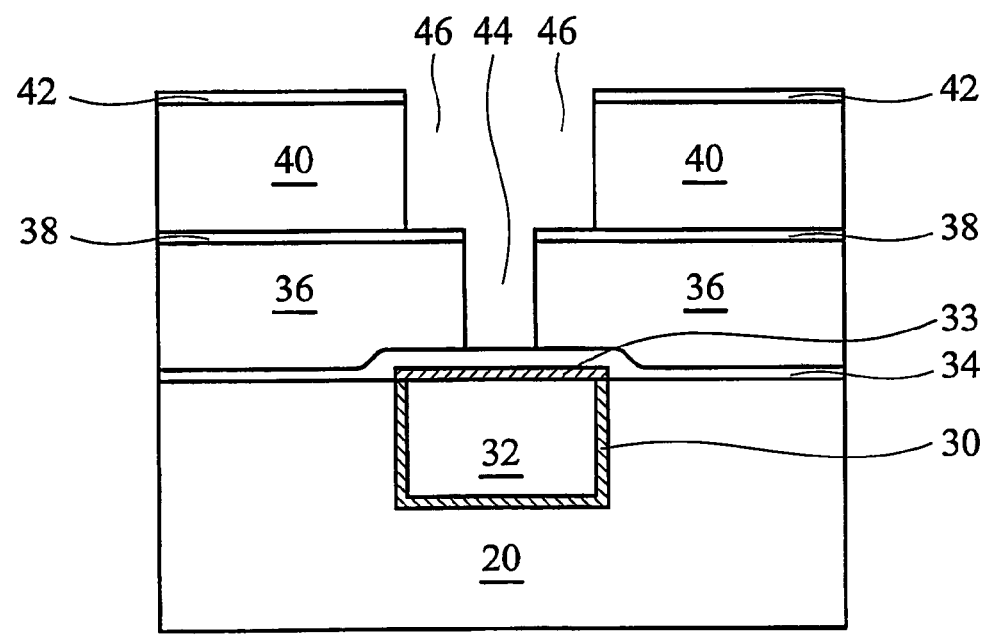

FIG. 8 illustrates the formation of a trench opening 46. An anisotropic etch cuts through the trench IMD 40 and thus forming the trench opening 46. Trench opening 46 will be used to form a second conductive line when filled.

Figure 9:
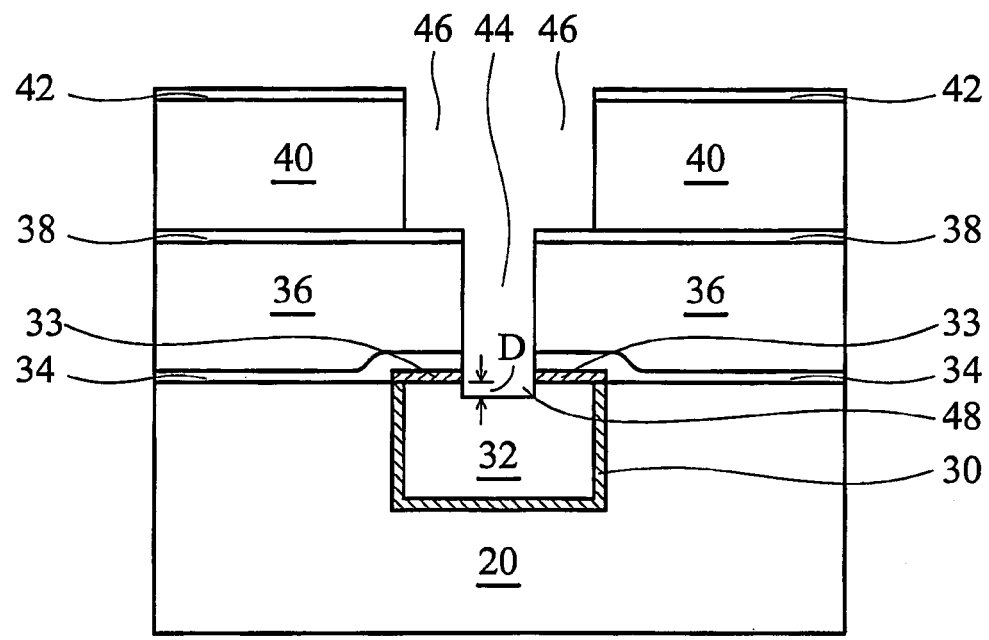

In the preferred embodiment, exposed portion of via ESL 34 is etched, preferably by using etchant comprising $CF_4$, $C_4F_8$, or $O_2$. FIG. 9 shows the structure after ESL 34 is etched. Because via ESL 34 is quite thin relative to the IMD layers 36 and 40, process control and end-point detection are much more closely controlled, thus limiting the likelihood of over-etching through the underlying first copper line 32. Etching continues into the metal cap 33 after ESL 34 is etched away. In one preferred embodiment, process is controlled so that the metal cap 33 is etched away, and its underlying copper 32 is also over etched to form a recess 48 in conductive line 32. In other embodiments, after over etching has reached into metal cap 33 or conductive line 32, a sputtering is performed to sputter out the remaining metal cap 33 and into underlying conductive line 32 to form a recess 48. The sputtering typically uses inert species such as argon or helium. Preferably, recess 48 has a depth D of between about 1 nm to about 100 nm, more preferably about 10 nm to about 100 nm.

Figure 10:
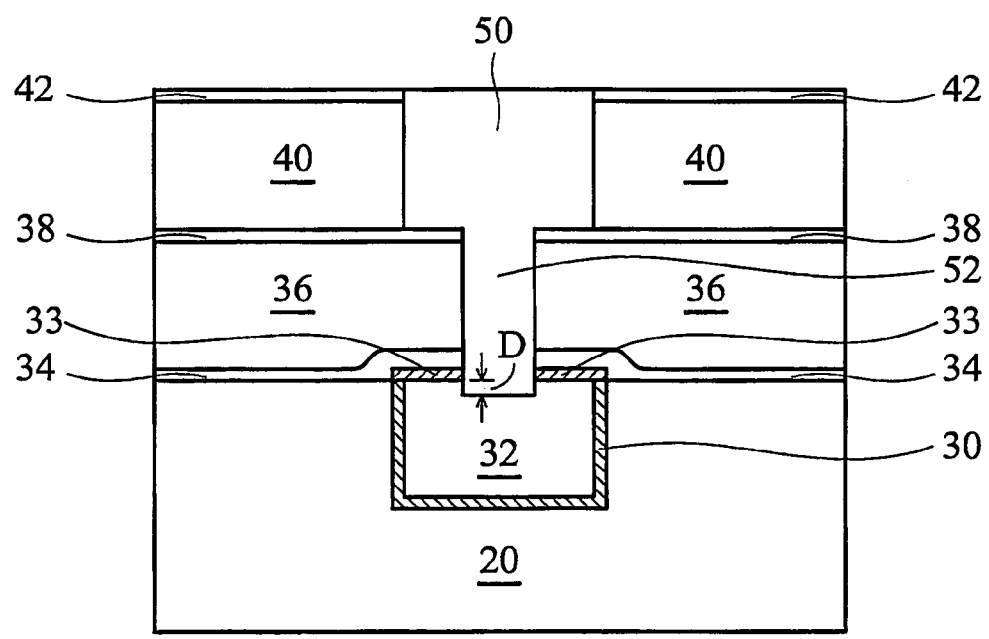

FIG. 10 illustrates formation of a second conductive line 50 and via 52 in openings 44 and 46 and recess 48. The via opening 44 and trench opening 46 are filled with conductive materials. Preferably, conductor line 50 and via 52 are formed of copper or copper alloys. Similar to the first conductive line, the material of the via 52 and second conductive line 50 preferably comprises at least about 10 atomic percent of copper. In alternative embodiments, conductive line 50 may comprises at least 50 atomic percent of aluminum, silver and gold. The resistivity of via 52 and conductive line 50 is preferably lower than about 4 ohm-cm. A CMP is performed to level the surface. A barrier layer (not shown) may be formed before the second conductive line 50 is formed. The barrier layer is preferably formed of a material comprising titanium, titanium nitride, tantalum, tantalum nitride, and other layers as well. The thickness of the barrier layer is preferably between about 2 nm to about 40 nm.

In another preferred embodiment, after the structure in FIG. 8 is formed, a barrier layer (not shown) is formed on the sidewalls of via opening 44, trench opening 46 and exposed portion of via ESL 34. An anisotropic etching or sputtering is then performed to remove materials at the bottom of the via opening 44, including barrier layer, via ESL 34, and metal cap 33. Recess 48 is then formed. The process in this embodiment removes the barrier layer formed between via 52 and conductive line 32. Therefore better contact is formed through a direct contact between copper and copper.

In the preferred embodiment, the recess 48 formed in the first conductive line 32 ensures that there is substantially no material of cap layer 48 left in exposed portion of via opening 44. The contact resistance is greatly reduced and RC delay reduced. The contact resistance is more predictable and process variation is reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit interconnection structure comprising:
   a first conductor extending from a surface of a base material into the base material;
   a conductive cap layer on the first conductor;
   a first dielectric on the conductive cap layer and the base material;
   a second dielectric on the first dielectric;
   an opening in the first dielectric, second dielectric, and conductive cap layer wherein the opening extends into the first conductor and forms a recess, and wherein the recess has a depth of greater than about 1 nm; and
   a second conductor over the second dielectric and filling the opening and the recess.

2. The interconnection structure of claim 1 wherein the first and second conductors comprise a material selected from the group consisting essentially of an alloy containing more than about 10 atomic percent of copper, an alloy containing more than about 50 atomic percent of aluminum, silver, gold, and combinations thereof.

3. The interconnection structure of claim 2 wherein the first and second conductors have a resistivity of lower than about 4 ohm-cm.

4. The interconnection structure of claim 1 wherein the conductive cap layer comprises a material selected from the group consisting essentially of cobalt, nickel, tungsten, molybdenum, tantalum, boron, phosphorous, and combinations thereof.

5. The interconnection structure of claim 1 wherein the conductive cap layer comprises a material selected from the group consisting essentially of CoP, CoB, CoWP, CoWB, NiWP, CoSnP, NiWB, CuSi, ZrN, NiMoP and combinations thereof.

6. The interconnection structure of claim 1 wherein the conductive cap layer has a thickness of between about 2 nm and about 20 nm.

7. The interconnection structure of claim 1 wherein the second dielectric comprises a material selected from the group consisting essentially of carbon-doped silicon oxide, fluorine-doped silicon oxide, organic low-k material, porous low-k material and combinations thereof.

8. The interconnection structure of claim 1 wherein the recess has a depth of between about 1 nm and about 10 nm.

9. The interconnection structure of claim 1 wherein the recess has a depth of between about 10 nm and about 100 nm.

* * * * *